US012663479B2

(12) United States Patent
Kim et al.

(10) Patent No.: US 12,663,479 B2
(45) Date of Patent: Jun. 23, 2026

(54) BATTERY SOC ESTIMATING APPARATUS AND METHOD

(71) Applicant: LG ENERGY SOLUTION, LTD., Seoul (KR)

(72) Inventors: Seung-Hyun Kim, Daejeon (KR); Hyun-Chul Lee, Daejeon (KR); Dong-Keun Kwon, Daejeon (KR); An-Soo Kim, Daejeon (KR); Chae-Bin Shin, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 227 days.

(21) Appl. No.: 18/718,683

(22) PCT Filed: Jan. 26, 2023

(86) PCT No.: PCT/KR2023/001211
§ 371 (c)(1),
(2) Date: Jun. 11, 2024

(87) PCT Pub. No.: WO2023/146309
PCT Pub. Date: Aug. 3, 2023

(65) Prior Publication Data
US 2025/0044364 A1 Feb. 6, 2025

(30) Foreign Application Priority Data
Jan. 26, 2022 (KR) ........................ 10-2022-0011728

(51) Int. Cl.
*G01R 31/388* (2019.01)
*G01R 31/3842* (2019.01)
(Continued)

(52) U.S. Cl.
CPC ....... *G01R 31/388* (2019.01); *G01R 31/3842* (2019.01); *H02J 7/94* (2026.01); *H02J 7/96* (2026.01)

(58) Field of Classification Search
CPC .............. G01R 31/3842; G01R 31/388; G01R 31/392; G01R 31/367; G01R 31/382;
(Continued)

(56) References Cited

U.S. PATENT DOCUMENTS 8,970,178 B2 * 3/2015 Berkowitz .............. B60L 58/12
320/141
9,559,543 B2 * 1/2017 Greening ............ H01M 10/425
(Continued)

FOREIGN PATENT DOCUMENTS

CN 105823988 A 8/2016
CN 107091994 A 8/2017
(Continued)

OTHER PUBLICATIONS

International Search Report (PCT/ISA/210) issued in PCT/KR2023/001211, dated May 17, 2023.
(Continued)

*Primary Examiner* — Vinh P Nguyen
(74) *Attorney, Agent, or Firm* — Birch, Stewart, Kolasch & Birch, LLP

(57) ABSTRACT

A battery state of charge estimating apparatus according to an embodiment of the present disclosure includes a charging and discharging unit for receiving a control signal including a C-rate and for charging and discharging a battery at the C-rate included in the control signal; a measuring unit for measuring a voltage of the battery in a charging and discharging process of the battery; and a control unit for transmitting the control signal to the charging and discharging unit, changing the C-rate included in the control signal (Continued)

whenever the voltage value measured by the measuring unit reaches a preset threshold value, and estimating SOC of the battery based on the result of comparing the changed C-rate with a preset cutoff value.

12 Claims, 2 Drawing Sheets

(51) Int. Cl.
*H02J 7/94*　(2026.01)
*H02J 7/96*　(2026.01)

(58) Field of Classification Search
CPC .. G01R 31/396; G01R 31/3835; G01R 19/10; G01R 31/385; G01R 19/16542; G01R 19/165; G01R 31/3828; G01R 31/378; G01R 31/3647; G01R 19/12; G01R 31/379; H02J 7/94; H02J 7/96; Y02E 60/10; Y02E 60/50; Y02T 10/92; G01N 33/48785
See application file for complete search history.

(56) References Cited

U.S. PATENT DOCUMENTS

| | | | | |
|---|---|---|---|---|
| 11,029,361 | B2 * | 6/2021 | Tsai | G01R 31/387 |
| 11,280,842 | B2 * | 3/2022 | Lee | G01R 31/3648 |
| 2007/0148532 | A1 | 6/2007 | Lim et al. | |
| 2014/0177145 | A1 | 6/2014 | Kawahara et al. | |
| 2016/0214500 | A1 | 7/2016 | Kim et al. | |
| 2017/0261560 | A1 | 9/2017 | Goto | |
| 2018/0203071 | A1 | 7/2018 | Takemura et al. | |
| 2020/0182940 | A1 | 6/2020 | Tsai | |
| 2021/0190878 | A1 | 6/2021 | Lee et al. | |
| 2021/0242707 | A1 | 8/2021 | Kim et al. | |
| 2022/0221516 | A1 | 7/2022 | Lee et al. | |
| 2022/0291286 | A1 | 9/2022 | Narimoto et al. | |
| 2022/0381841 | A1 | 12/2022 | Bae et al. | |

FOREIGN PATENT DOCUMENTS

| | | |
|---|---|---|
| JP | 6351852 B2 | 7/2018 |
| JP | 2021-12106 A | 2/2021 |
| JP | 2021-34268 A | 3/2021 |
| KR | 10-0669477 B1 | 1/2007 |
| KR | 10-1717182 B1 | 3/2017 |
| KR | 10-2019-0056079 A | 5/2019 |
| KR | 10-2037378 B1 | 10/2019 |
| KR | 10-2020-0117794 A | 10/2020 |
| KR | 10-2021-0037424 A | 4/2021 |
| KR | 10-2021-0097531 A | 8/2021 |
| KR | 10-2351637 B1 | 1/2022 |

OTHER PUBLICATIONS

Extended European Search Report for European Application No. 23747350.9, dated Sep. 20, 2024.

* cited by examiner

BATTERY SOC ESTIMATING APPARATUS AND METHOD

TECHNICAL FIELD

The present application claims priority to Korean Patent Application No. 10-2022-0011728 filed on Jan. 26, 2022 in the Republic of Korea, the disclosures of which are incorporated herein by reference.

The present invention relates to a battery state of charge (SOC) estimating apparatus and method, and more particularly, to a battery SOC estimating apparatus and method for estimating a SOC of a battery.

BACKGROUND ART

Recently, the demand for portable electronic products such as notebook computers, video cameras and portable telephones has increased sharply, and electric vehicles, energy storage batteries, robots, satellites and the like have been developed in earnest.

Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-discharging rate and high energy density.

In general, the SOC of the battery can be estimated from the current integration method for integrating a charge/discharge current or the open circuit voltage (OCV) measured in consideration of the correspondence between SOC and OCV. In addition, a method of estimating SOC using the EKF (Extended Kalman Filter) of the battery model using the voltage behavior of the battery is also used.

Since OCV is a value that can be measured in an idle state, the current integration method is mainly used in the charging and discharging process. However, the current integration method has a disadvantage that the SOC estimate result is inaccurate when errors accumulate during current integration or when the initial SOC value is not accurate.

DISCLOSURE

Technical Problem

The present disclosure is directed to providing a battery SOC estimating apparatus and method capable of more accurately estimating SOC of a battery by changing a charge/discharge C-rate and comparing the changed charge/discharge C-rate with a cutoff value.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery state of charge (SOC) estimating apparatus according to one aspect of the present disclosure may comprise a charging and discharging unit configured to receive a control signal including a C-rate and charge and discharge a battery at the C-rate included in the control signal; a measuring unit configured to measure a voltage of the battery in a charging and discharging process of the battery; and a control unit configured to transmit the control signal to the charging and discharging unit, change the C-rate included in the control signal in response to the voltage value measured by the measuring unit reaching a preset threshold value, and estimate a SOC of the battery based on the result of comparing the changed C-rate with a preset cutoff value.

In response to the measured voltage value reaching the preset threshold voltage value, the control unit may be configured to decrease the C-rate by a preset C-rate change ratio.

In response the changed C-rate being equal to or less than the cutoff value, the control unit may be configured to estimate the SOC of the battery as a preset SOC.

In response to the changed C-rate becoming equal to or less than the cutoff value while the battery is being charged, the control unit may be configured to estimate the SOC of the battery as 100.

In response to the changed C-rate becoming equal to or less than the cutoff value while the battery is being discharged, the control unit may be configured to estimate the SOC of the battery as 0%.

In response to the changed C-rate exceeding the cutoff value, the control unit may be configured to set a criterion SOC for the battery at an initial change time when the C-rate is initially changed, and estimate the SOC of the battery based on the criterion SOC, a number of changes of the C-rate after the initial change time and an expected number of changes of the C-rate expected until charging and discharging of the battery is terminated in the charging and discharging process.

In response to the changed C-rate exceeding the cutoff value, the control unit may be configured to estimate SOC of the battery based on Equation 1 below.

$$B_{SOC} = R_{SOC} + \frac{|T_{SOC} - R_{SOC}|}{n} \times m \qquad \text{[Equation 1]}$$

Here, $B_{SOC}$ may be an estimated SOC of the battery, $T_{SOC}$ may be a SOC value determined in advance according to a charging and discharging state of the battery, $R_{SOC}$ may be the criterion SOC, n may be the expected number of changes of the C-rate, and m may be the number of changes of the C-rate.

The control unit may be configured to calculate the expected number of changes of the C-rate based on the changed C-rate, the cutoff value and a preset C-rate change ratio.

The control unit may be configured to calculate the expected number of changes of the C-rate based on Equation 2 below.

$$n = \left\lceil \log_d \frac{x}{y} \right\rceil \qquad \text{[Equation 2]}$$

Here, n may be the expected number of changes of the C-rate, d may be the C-rate change ratio, x may be the cutoff value, and y may be an initial C-rate value included in the control signal.

The measuring unit may be configured to further measure a current of the battery in the charging and discharging process.

The control unit may be configured to set the criterion SOC by integrating the current of the battery measured by the measuring unit from a start time of the charging and discharging to the initial change time.

In response to the changed C-rate being less than or equal to the cutoff value, the control unit may be configured to transmit a charging and discharging termination signal to the charging and discharging unit for terminating charging and discharging of the battery.

In response to the changed C-rate exceeding the cutoff value, the control unit may be configured to transmit the control signal including the changed C-rate to the charging and discharging unit.

A battery pack according to another aspect of the present disclosure may comprise the battery SOC estimating apparatus according to an aspect of the present disclosure.

A battery state of charge (SOC) estimating method according to another aspect of the present disclosure may comprise a charging and discharging step of receiving a control signal including a C-rate and charging and discharging a battery at the C-rate included in the control signal; a voltage measuring step of measuring a voltage of the battery in a charging and discharging process of the battery; a C-rate changing step of changing the C-rate included in the control signal in response to the voltage value measured in the voltage measuring step reaches a preset threshold voltage value; and a SOC estimating step of estimating a SOC of the battery based on the result of comparing the C-rate changed in the C-rate changing step with a preset cutoff value.

Advantageous Effects

According to one aspect of the present disclosure, the SOC of the battery can be more accurately estimated by charging and discharging the battery while changing the C-rate. In particular, the present disclosure has an advantage of accurately estimating the SOC of the battery even if the initial C-rate and temperature are not limitedly set to specific values.

The effects of the present disclosure are not limited to the above, and other effects not mentioned herein will be clearly understood by those skilled in the art from the appended claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, throughout the specification, when a portion is referred to as being "connected" to another portion, it is not limited to the case that they are "directly connected", but it also includes the case where they are "indirectly connected" with another element being interposed between them.

Hereinafter, a preferred embodiment of the present disclosure will be described in detail with reference to the accompanying drawings.

Figure 1:
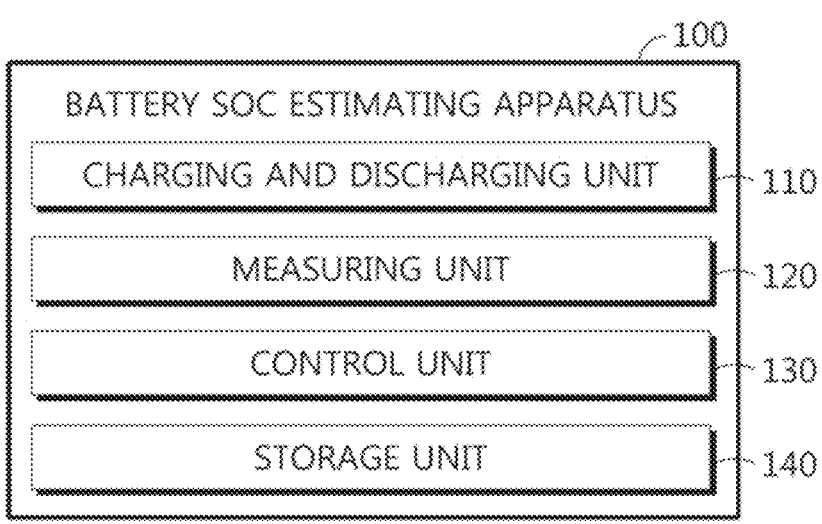
FIG. 1 is a diagram schematically showing a battery SOC estimating apparatus according to an embodiment of the present disclosure.

FIG. 1 is a diagram schematically showing a battery SOC estimating apparatus 100 according to an embodiment of the present disclosure.

Referring to FIG. 1, the battery SOC estimating apparatus 100 according to an embodiment of the present disclosure may include a charging and discharging unit 110, a measuring unit 120, and a control unit 130.

The charging and discharging unit 110 may be configured to receive a control signal including C-rate information (Current rate information).

For example, the charging and discharging unit 110 may be communicatively connected to the control unit 130 through wired and/or wireless communication. Also, the charging and discharging unit 110 may receive a control signal including C-rate information from the control unit 130.

Specifically, the initial value of the C-rate information included in the control signal may be directly set by the control unit 130 according to battery specifications or set by an input of a user.

The charging and discharging unit 110 may be configured to charge and discharge a battery at the C-rate included in the control signal.

Here, the battery refers to one physically separable independent cell having a negative electrode terminal and a positive electrode terminal. For example, a lithium-ion battery or a lithium polymer cell may be regarded as the battery. In addition, the battery may refer to a battery module in which a plurality of cells are connected in series and/or in parallel. Hereinafter, for convenience of description, a battery will be described as meaning one independent cell.

Specifically, the charging and discharging unit 110 may read the C-rate information included in the control signal and charge or discharge the battery at a corresponding C-rate.

For example, when the C-rate is preset to 1 C, the charging and discharging unit 110 may charge the battery at a C-rate of 1 C or discharge the battery at a C-rate of 1 C.

However, it should be noted that the value of C-rate information that can be included in the control signal is not particularly limited. That is, the value of C-rate information may be set to 0.05 C or higher. Preferably, the value of C-rate information may be set to 0.05 C or more and 3 C or less.

The measuring unit 120 may be configured to measure the voltage of the battery in the charging and discharging process of the battery.

Specifically, the measuring unit 120 may be connected to the positive electrode terminal and the negative electrode terminal of the battery. In addition, the measuring unit 120 may measure the voltage of the battery by measuring the positive electrode voltage and the negative electrode voltage of the battery and calculating the difference between the positive electrode voltage and the negative electrode voltage. That is, the measuring unit 120 may measure the terminal voltage of the battery in the charging and discharging process of the battery.

The control unit 130 may be configured to transmit a control signal to the charging and discharging unit 110. As described above, the control unit 130 may generate a control signal including C-rate information and transmit the generated control signal to the charging and discharging unit 110.

The control unit 130 may be configured to change the C-rate included in the control signal whenever the voltage value measured by the measuring unit 120 reaches a preset threshold value.

Here, the preset threshold value may be set in each of a charging process and a discharging process. Preferably, the preset threshold value may be a voltage value at which constant voltage charging or constant voltage discharging starts.

In general, the charging process may include a constant current (CC) charging process and a constant voltage (CV) charging process. For example, constant current charging may be performed until the voltage of the battery reaches 3.8V, and constant voltage charging may be performed after 3.8V. In this case, the threshold value may be preset to 3.8V, which is a voltage value at which constant voltage charging starts. Likewise, in the discharge process, a voltage value at which the constant voltage discharge starts may be set as a threshold value.

More specifically, the control unit 130 may be configured to decrease the C-rate by a preset C-rate change ratio whenever the measured voltage value reaches a preset threshold value.

For example, it is assumed that the threshold value is set to 3.8V, the C-rate change ratio is 0.5, and the initial C-rate is preset to 1 C during the charging process of the battery.

The charging and discharging unit 110 may receive a control signal including information about C-rate (1 C) from the control unit 130 and charge the battery with 1 C. When the voltage value measured by the measuring unit 120 reaches 3.8V, the control unit 130 may decrease the value of C-rate information included in the control information from 1 C to 0.5 C.

In addition, the charging and discharging unit 110 may receive a control signal including information about the C-rate (0.5 C) from the control unit 130 and reduce the C-rate of the battery to 0.5 C. In this case, since the C-rate is reduced from 1 C to 0.5 C, the voltage value measured by the measuring unit 120 may decrease.

Specifically, the voltage of the battery is calculated based on Ohm's law, and since the C-rate corresponding to "I" in the formula of "V=IR" is reduced, the voltage of the battery to be measured can be reduced.

More specifically, in the general constant voltage charging process, the charging current gradually decreases to keep the voltage of the battery at a certain level, but in the present disclosure, the C-rate is rapidly changed according to the C-rate change ratio, so voltage can be reduced.

Thereafter, the battery is charged at a C-rate of 0.5 C, and when the voltage of the battery reaches 3.8V again, the control unit 130 may reduce C-rate information included in the control signal to 0.25 C.

Figure 2:
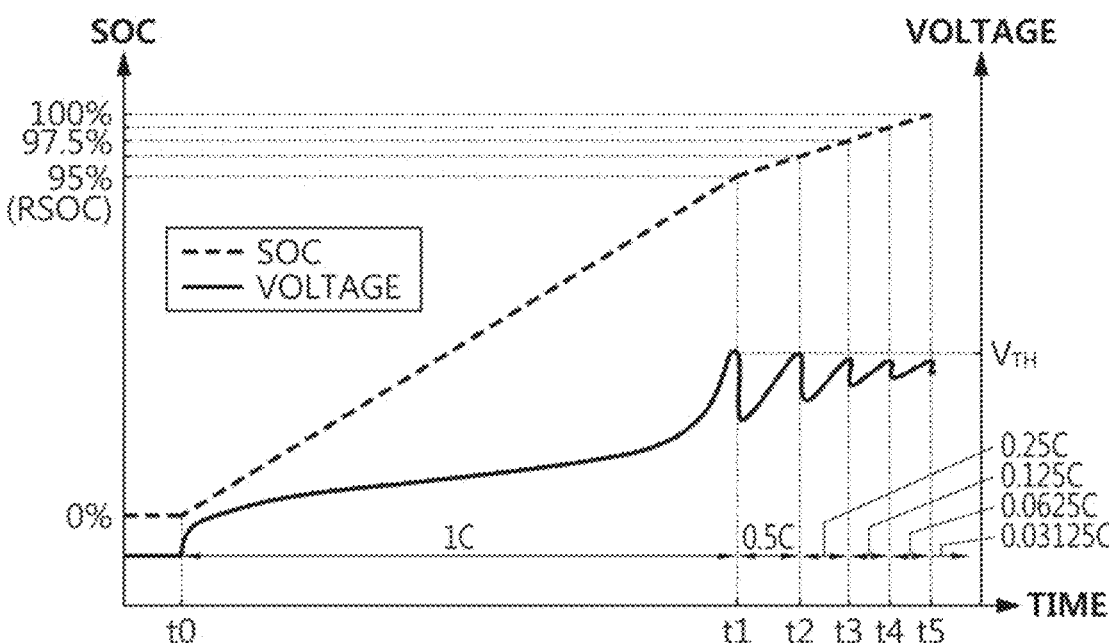
FIG. 2 is a diagram showing an embodiment in which the battery SOC estimating apparatus according to an embodiment of the present disclosure estimates SOC of a battery.

FIG. 2 is a diagram showing an embodiment in which the battery SOC estimating apparatus 100 according to an embodiment of the present disclosure estimates SOC of a battery.

In the embodiment of FIG. 2, charging of the battery may be started at time point t0. Specifically, at time point t0, the control unit 130 may transmit a control signal to the charging and discharging unit 110. The charging and discharging unit 110 may read C-rate information included in the control signal and start charging the battery at a corresponding C-rate.

From time point t0 to time point t1, the battery can be charged at 1 C.

At time point t1, the voltage of the battery may reach the threshold value ($V_{TH}$). In this case, the control unit 130 may reduce the value of C-rate information included in the control signal according to the C-rate change ratio. For example, the control unit 130 may decrease the value of C-rate information included in the control signal from 1 C to 0.5 C.

From time point t1 to time point t2, the battery can be charged at 0.5 C.

At time point t2, the voltage of the battery may reach the threshold value ($V_{TH}$) again. For example, the control unit 130 may reduce the value of C-rate information included in the control signal from 0.5 C to 0.25 C.

From time point t2 to time point t3, the battery can be charged at 0.25 C.

At time point t3, the voltage of the battery may reach the threshold value ($V_{TH}$) again. For example, the control unit 130 may decrease the value of C-rate information included in the control signal from 0.25 C to 0.125 C.

From time point t3 to time point t4, the battery can be charged at 0.125 C.

At time point t4, the voltage of the battery may reach the threshold value ($V_{TH}$) again. For example, the control unit 130 may decrease the value of C-rate information included in the control signal from 0.125 C to 0.0625 C.

From time point t4 to time point t5, the battery can be charged at 0.0625 C.

At time point t5, the voltage of the battery may reach the threshold value ($V_{TH}$) again. For example, the control unit 130 may decrease the value of C-rate information included in the control signal from 0.0625 C to 0.03125 C.

In addition, charging of the battery may be terminated at the time point t5.

The control unit 130 may be configured to estimate the SOC of the battery based on a result of comparing the changed C-rate with a preset cutoff value.

Here, the cutoff value is a predetermined C-rate value, and may be a reference value for terminating charging and discharging of the battery. For example, the cutoff value may be preset to 0.05 C.

That is, the control unit 130 may change the C-rate value included in the control signal whenever the voltage value of the battery reaches the threshold value ($V_{TH}$), and compare the changed C-rate value with the cutoff value. Also, the control unit 130 may estimate the SOC of the battery according to the comparison result.

Specifically, the control unit 130 may estimate the SOC of the battery as a preset SOC when the changed C-rate is less than or equal to the cutoff value. Here, the case where the changed C-rate is less than or equal to the cutoff value may correspond to a condition in which charging or discharging of the battery is terminated.

For example, when the changed C-rate becomes equal to or less than the cutoff value while the battery is being charged, the control unit 130 may be configured to estimate the SOC of the battery as 100%. Conversely, when the changed C-rate becomes equal to or less than the cutoff value while the battery is being discharged, the control unit 130 may be configured to estimate the SOC of the battery as 0%.

As in the previous embodiment, in the embodiment of FIG. 2, assuming that the battery starts to be charged at 1 C at time point t0, the cutoff value may be set to 0.05 C in advance. At time points t1, t2, t3, t4, and t5, the voltage value of the battery reaches the threshold value ($V_{TH}$), respectively, and at time point t5, the control unit 130 may change the C-rate to 0.03125 C. Since the changed C-rate (0.03125 C) is equal to or less than the cutoff value (0.05 C), the control unit 130 may estimate the SOC of the battery as 100% at time point t5.

The current integration method, which is generally used for SOC estimation, has a disadvantage that the SOC estimate result is inaccurate when errors are accumulated during current integration or when the initial SOC value is not accurate.

Therefore, in the present disclosure, the SOC of the battery may be estimated by considering the characteristics of the battery that the final charge or discharge amount is the same under the same cutoff condition. Due to this, the SOC estimation error according to the current integration method is corrected so that the SOC of the battery can be accurately estimated.

Here, the battery characteristic considered in the present disclosure is that even if the charging and discharging C-rate and the temperature of the battery are different, charging and discharging can be performed at a uniform amount under the same cutoff condition. For example, when a predetermined cutoff value (e.g., 0.05 C) is applied as described in the present disclosure, the final charge or discharge amount may be the same even if the initial C-rate and the temperature of the battery are different.

Therefore, the present disclosure has an advantage of accurately estimating the SOC of the battery based on the result of comparing the changed C-rate and the cutoff value.

Meanwhile, the control unit 130 included in the battery SOC estimating apparatus 100 may optionally include an application-specific integrated circuit (ASIC), another chipset, a logic circuit, a register, a communication modem, and a data processing device, and the like, known in the art to execute various control logics disclosed below. Also, when the control logic is implemented as software, the control unit 130 may be implemented as a set of program modules. At this time, the program modules may be stored in a memory and executed by the control unit 130. The memory may be internal or external to the control unit 130 and may be connected to the control unit 130 by various well-known means.

In addition, the battery SOC estimating apparatus 100 may further include a storage unit 140. The storage unit 140 may store data necessary for operation and function of each component of the battery SOC estimating apparatus 100, data generated in the process of performing the operation or function, or the like. The storage unit 140 is not particularly limited in its kind as long as it is a known information storage means that can record, erase, update and read data. As an example, the information storage means may include RAM, flash memory, ROM, EEPROM, registers, and the like. In addition, the storage unit 140 may store program codes in which processes executable by the control unit 130 are defined.

The control unit 130 may be configured to transmit a control signal including the changed C-rate to the charging and discharging unit 110 when the changed C-rate exceeds a cutoff value. Conversely, the control unit 130 may be configured to transmit a charging and discharging termination signal for terminating charging and discharging of the battery to the charging and discharging unit 110 when the changed C-rate is less than or equal to the cutoff value.

Specifically, when the changed C-rate exceeds the cutoff value, the control unit 130 may be configured to set a criterion SOC for the battery at an initial change time when the C-rate is initially changed.

Here, the initial change time may be a time point at which the voltage value of the battery initially reaches the threshold value ($V_{TH}$) in the charging and discharging process.

For example, in the embodiment of FIG. 2, since the voltage value of the battery reaches the threshold value ($V_{TH}$) at time point t1, the control unit 130 may change the C-rate. Accordingly, in the embodiment of FIG. 2, the time point t1 may be an initial change time.

More specifically, the criterion SOC at the initial change time may be set by the current integration method. To this end, the measuring unit 120 may be configured to further measure the current of the battery in the charging and discharging process. In addition, the control unit 130 may be configured to set the criterion SOC by integrating the current of the battery measured by the measuring unit 120 from the charging and discharging start time to the initial change time.

For example, in the embodiment of FIG. 2, the measuring unit 120 may measure the charging current of the battery from time point t0 at which charging of the battery starts to time point t1. Also, the battery may set the criterion SOC at the time point t1 to 95% by integrating the charging current from time point t0 to time point t1.

In addition, the control unit 130 may be configured to estimate the SOC of the battery based on the criterion SOC, the number of changes of the C-rate after the initial change time, and the expected number of changes of the C-rate expected until charging and discharging of the battery is terminated in the charging and discharging process.

Specifically, the control unit 130 may estimate the SOC when charging and discharging is in progress (when the changed C-rate initializes the cutoff value), in consideration of the ratio of the number of changes of the C-rate to the expected number of changes and the criterion SOC.

More specifically, the control unit 130 may be configured to estimate the SOC of the battery based on Equation 1 below.

$$B_{SOC} = R_{SOC} + \frac{|T_{SOC} - R_{SOC}|}{n} \times m \qquad \text{[Equation 1]}$$

Here, $B_{SOC}$ may be an estimated SOC of the battery, $T_{SOC}$ may be a SOC value determined in advance according to a charging and discharging state of the battery, $R_{SOC}$ may be the criterion SOC, n may be the expected number of changes of the C-rate, and m may be the number of changes of the C-rate.

For example, in the embodiment of FIG. 2, an embodiment in which the control unit 130 estimates the SOC of the battery at time point t3 will be described. The control unit 130 may change the C-rate from 0.25 C to 0.125 C at the time point t3. At the time point t3, the number of changes (m) of the C-rate by the control unit 130 is two except for the initial change time (t1).

In addition, when the initial C-rate (1 C) is changed to the preset C-rate change ratio (0.5), the time point at which the changed C-rate becomes equal to or less than the cutoff value is the time point t5, so the expected number of changes (n) of the C-rate is four excluding the initial change time (t1). Here, the expected number of changes may be calculated by the control unit 130 through the initial C-rate and the change ratio even if the charging and discharging of the battery is not terminated.

In the embodiment of FIG. 2, since the battery is being charged, the predetermined SOC value ($T_{SOC}$) is 100%, and the criterion SOC ($R_{SOC}$) set at the initial change time (t1) is 95%. Accordingly, the control unit 130 may calculate "95+{(100−95)÷4×2}" according to Equation 1 and estimate the SOC ($B_{SOC}$) at time point t3 to be 97.5%.

Therefore, the battery SOC estimating apparatus 100 according to an embodiment of the present disclosure has an advantage of estimating the SOC of the battery not only when charging and discharging of the battery is terminated but also when charging and discharging is in progress.

Meanwhile, referring to Equation 1, at a time point where the changed C-rate becomes equal to or less than the cutoff value, the expected number of changes (n) and the number of changes (m) of the C-rate may be the same. If so, the estimated SOC ($B_{SOC}$) will be equal to the predetermined SOC value ($T_{SOC}$). Therefore, even according to Equation 1 when charging and discharging is terminated (when the changed C-rate becomes less than or equal to the cutoff value), the control unit 130 may estimate the SOC of the battery as a predetermined SOC value.

In addition, the control unit 130 may be configured to calculate the expected number of changes of the C-rate based on the changed C-rate, the cutoff value, and the preset C-rate change ratio.

Specifically, the control unit 130 may be configured to calculate the expected number of changes of the C-rate based on Equation 2 below.

$$n = \left\lfloor \log_d \frac{x}{y} \right\rfloor \qquad \text{[Equation 2]}$$

Here, n may be the expected number of changes of the C-rate, d may be the C-rate change ratio, x may be the cutoff value, and y may be an initial C-rate value included in the control signal. Also, in Equation 2, the floor function ($\lfloor \ \rfloor$) is for excluding the number of changes of the C-rate at the initial change time.

For example, in the embodiment of FIG. 2, the C-rate change ratio (d) may be 0.5, the initial C-rate value (y) included in the control signal may be 1 C, and the cutoff value may be 0.05 C. Accordingly, the control unit 130 may calculate the formula of "$\lfloor \log_{0.5}(0.05 \div 1) \rfloor$" to calculate the expected number of changes (n) of the C-rate as four. The expected number of changes (n) of the C-rate calculated in this way may be applied to Equation 1 and used to estimate the SOC of the battery.

That is, when a predetermined cutoff value (e.g., 0.05 C) is applied, the battery SOC estimating apparatus 100 according to an embodiment of the present disclosure has an advantage of accurately estimating the SOC of the battery, considering the characteristic of the battery that the final amount of charge or discharge is the same even if the initial C-rate and the temperature of the battery are different.

In addition, according to an embodiment of the present disclosure, since the SOC value calculated by the current integration method may be corrected through comparison between the changed C-rate and the cutoff value, there is also an advantage of accurately estimating the SOC for a LFP battery which shows a flat section (Plateau) in the SOC-OCV profile.

The battery SOC estimating apparatus 100 according to the present disclosure may be applied to a battery management system (BMS). That is, the BMS according to the present disclosure may include the battery SOC estimating apparatus 100 described above. In this configuration, at least some of components of the battery SOC estimating apparatus 100 may be implemented by supplementing or adding functions of the components included in a conventional BMS. For example, the charging and discharging unit 110, the measuring unit 120, the control unit 130 and the storage unit 140 of the battery SOC estimating apparatus 100 may be implemented as components of the BMS.

In addition, the battery SOC estimating apparatus 100 according to the present disclosure may be provided to a battery pack 1. That is, the battery pack 1 according to the present disclosure may include the above-described battery SOC estimating apparatus 100 and one or more battery cells. In addition, the battery pack 1 may further include electrical components (a relay, a fuse and the like) and a case.

Figure 3:
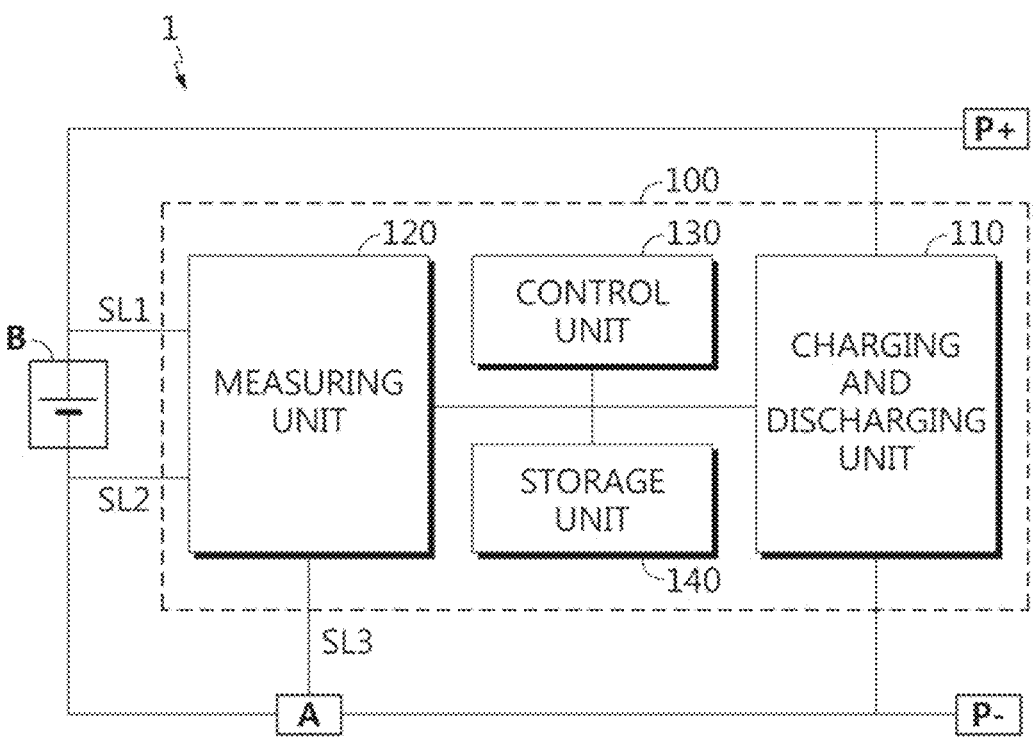
FIG. 3 is a diagram schematically showing an exemplary configuration of a battery pack according to another embodiment of the present disclosure.

FIG. 3 is a diagram schematically showing an exemplary configuration of a battery pack 1 according to another embodiment of the present disclosure.

Referring to FIG. 3, the positive electrode of the battery B may be connected to the positive electrode terminal P+ of the battery pack 1, and the negative electrode of the battery B may be connected to the negative electrode terminal P− of the battery pack 1.

The measuring unit 120 may be connected between the positive electrode of the battery B and the positive electrode terminal P+ of the battery pack 1 through the first sensing line SL1, and may be connected between the negative electrode of the battery B and the negative electrode terminal P− of the battery pack 1 through the second sensing line SL2. Accordingly, the measuring unit 120 may measure the voltage of the battery B through the first sensing line SL1 and the second sensing line SL2.

In addition, the measuring unit 120 may be connected to a current measurement element A provided on the charging and discharging path (large current path) of the battery B through the third sensing line SL3 to measure the charging and discharging current of the battery B. Here, the current measurement element A may be a current meter and/or a shunt resistor.

One end of the charging and discharging unit 110 may be connected between the positive electrode of the battery B and the positive electrode terminal P+ of the battery pack 1, and the other end may be connected between the negative electrode of the battery B and the negative electrode terminal P– of the battery pack 1. In addition, the charging and discharging unit 110 may charge and discharge the battery B based on the C-rate information included in the control signal received from the control unit 130.

Figure 4:
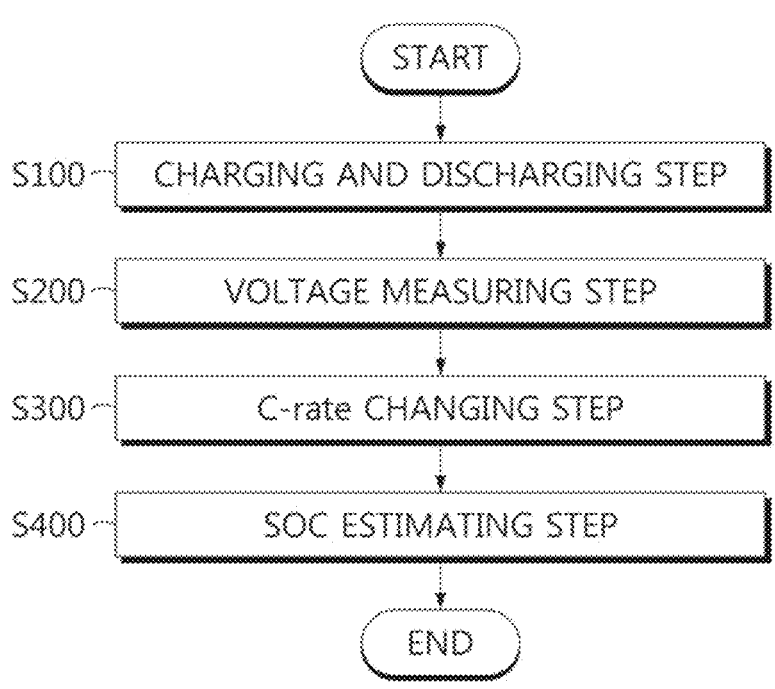
FIG. 4 is a diagram schematically showing a battery SOC estimating method according to still another embodiment of the present disclosure.

FIG. 4 is a diagram schematically showing a battery SOC estimating method according to still another embodiment of the present disclosure.

Preferably, each step of the battery SOC estimating method may be performed by the battery SOC estimating apparatus 100. Hereinafter, for convenience of explanation, it should be noted that the content overlapping with the previously described content will be briefly described or omitted.

Referring to FIG. 4, the battery SOC estimating method may include a charging and discharging step (S100), a voltage measuring step (S200), a C-rate changing step (S300), and an SOC estimating step (S400).

The charging and discharging step (S100) is a step of receiving a control signal including C-rate information and charging and discharging the battery B at the C-rate included in the control signal, and may be performed by the charging and discharging unit 110.

For example, the charging and discharging unit 110 may receive a control signal including C-rate information from the control unit 130. In addition, the charging and discharging unit 110 may read C-rate information included in the control signal and charge or discharge the battery B at a corresponding C-rate.

The voltage measuring step (S200) is a step of measuring a voltage of the battery B in the charging and discharging process of the battery B, and may be performed by the measuring unit 120.

The C-rate changing step (S300) is a step of changing a C-rate whenever the voltage value measured in the voltage measuring step (S200) reaches a preset threshold value (V$_{TH}$), and may be performed by the control unit 130.

Specifically, the control unit 130 may be configured to change the C-rate to a preset C-rate change ratio whenever the measured voltage value reaches the preset threshold value (V$_{TH}$).

For example, the control unit 130 may decrease the C-rate at a rate of 0.5 whenever the measured voltage value reaches the preset threshold value (V$_{TH}$).

The SOC estimating step (S400) is a step of estimating a SOC of the battery B based on the result of comparing the C-rate changed in the C-rate changing step (S300) with a preset cutoff value, and may be performed by the control unit 130.

Specifically, when the changed C-rate is less than or equal to the cutoff value, the control unit 130 may estimate the SOC of the battery B as a preset SOC. Also, the control unit 130 may be configured to transmit a charging and discharging termination signal for terminating charging and discharging of the battery B to the charging and discharging unit 110.

Conversely, when the changed C-rate exceeds the cutoff value, the control unit 130 may be configured to estimate the SOC of the battery B based on Equation 1 and Equation 2 described above. Also, the control unit 130 may be configured to transmit a control signal including the changed C-rate to the charging and discharging unit 110.

The embodiments of the present disclosure described above may not be implemented only through an apparatus and method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

In addition, since the present disclosure described above can be substituted, modified and changed in various ways by those skilled in the art without departing from the technical idea of the present disclosure, the present disclosure is not limited by the embodiments described above and the accompanying drawings, and all or some of the embodiments may be selectively combined to enable various modifications.

EXPLANATION OF REFERENCE SIGNS

1: battery pack
100: battery SOC estimating apparatus
110: charging and discharging unit
120: measuring unit
130: control unit
140: storage unit

What is claimed is:

1. A battery state of charge (SOC) estimating apparatus, comprising:
   a charging and discharging unit configured to:
     receive a control signal including a C-rate; and
     charge and discharge a battery at the C-rate included in the control signal;
   a measuring unit configured to measure a voltage of the battery in a charging and discharging process of the battery; and
   a control unit configured to:
     transmit the control signal to the charging and discharging unit,
     change the C-rate included in the control signal in response to the voltage value measured by the measuring unit reaching a preset threshold voltage value, and
     estimate a SOC of the battery based on a result of comparing the changed C-rate with a preset cutoff value.

2. The battery SOC estimating apparatus according to claim 1,
   wherein in response to the measured voltage value reaching the preset threshold voltage value, the control unit is configured to decrease the C-rate by a preset C-rate change ratio.

3. The battery SOC estimating apparatus according to claim 1,
   wherein in response the changed C-rate being equal to or less than the cutoff value, the control unit is configured to estimate the SOC of the battery as a preset SOC.

4. The battery SOC estimating apparatus according to claim 3,
    wherein the control unit is configured to:
        in response to the changed C-rate becoming equal to or less than the cutoff value while the battery is being charged, estimate the SOC of the battery as 100%, and
        in response to the changed C-rate becoming equal to or less than the cutoff value while the battery is being discharged, estimate the SOC of the battery as 0%.

5. The battery SOC estimating apparatus according to claim 1,
    wherein in response to the changed C-rate exceeding the cutoff value, the control unit is configured to:
    set a criterion SOC for the battery at an initial change time when the C-rate is initially changed, and
    estimate the SOC of the battery based on the criterion SOC, a number of changes of the C-rate after the initial change time and an expected number of changes of the C-rate expected until charging and discharging of the battery is terminated in the charging and discharging process.

6. The battery SOC estimating apparatus according to claim 5,
    wherein in response to the changed C-rate exceeding the cutoff value the control unit is configured to estimate SOC of the battery based on Equation 1 below, $$B_{SOC} = R_{SOC} + \frac{|T_{SOC} - R_{SOC}|}{n} \times m \qquad \text{[Equation 1]}$$

where $B_{SOC}$ is an estimated SOC of the battery, $T_{SOC}$ is a SOC value determined in advance according to a charging and discharging state of the battery, $R_{SOC}$ is the criterion SOC, n is the expected number of changes of the C-rate, and m is the number of changes of the C-rate.

7. The battery SOC estimating apparatus according to claim 5,
    wherein the control unit is configured to calculate the expected number of changes of the C-rate based on the changed C-rate, the cutoff value and a preset C-rate change ratio.

8. The battery SOC estimating apparatus according to claim 7,
    wherein the control unit is configured to calculate the expected number of changes of the C-rate based on Equation 2 below, $$n = \left\lfloor \log_d \frac{x}{y} \right\rfloor \qquad \text{[Equation 2]}$$

where n is the expected number of changes of the C-rate, d is the C-rate change ratio, x is the cutoff value, and y is an initial C-rate value included in the control signal.

9. The battery SOC estimating apparatus according to claim 5,
    wherein the measuring unit is configured to further measure a current of the battery in the charging and discharging process, and
    wherein the control unit is configured to set the criterion SOC by integrating the current of the battery measured by the measuring unit from a start time of the charging and discharging to the initial change time.

10. The battery SOC estimating apparatus according to claim 1,
    wherein in response to the changed C-rate being less than or equal to the cutoff value, the control unit is configured to transmit a charging and discharging termination signal to the charging and discharging unit for terminating charging and discharging of the battery, and
    wherein in response to the changed C-rate exceeding the cutoff value, the control unit is configured to transmit the control signal including the changed C-rate to the charging and discharging unit.

11. A battery pack, comprising the battery SOC estimating apparatus according to claim 1.

12. A battery state of charge (SOC) estimating method, comprising:
    a charging and discharging step of receiving a control signal including a C-rate and charging and discharging a battery at the C-rate included in the control signal;
    a voltage measuring step of measuring a voltage of the battery in a charging and discharging process of the battery;
    a C-rate changing step of changing the C-rate included in the control signal in response to the voltage value measured in the voltage measuring step reaching a preset threshold voltage value; and
    a SOC estimating step of estimating a SOC of the battery based on a result of comparing the C-rate changed in the C-rate changing step with a preset cutoff value.

\* \* \* \* \*